July 6, 1965

J. M. GAULT 3,193,612

HOUSING FOR SEMICONDUCTOR DEVICES

Filed Jan. 19, 1961

INVENTOR.
JOHN M. GAULT

BY
OSTROLENK, FABER, GERB & SOFFEN

ATTORNEYS

United States Patent Office 3,193,612

Patented July 6, 1965

3,193,612

HOUSING FOR SEMICONDUCTOR DEVICES

John M. Gault, Manhattan Beach, Calif., assignor to International Rectifier Corporation, El Segundo, Calif., a corporation of California Filed Jan. 19, 1961, Ser. No. 83,778
2 Claims. (Cl. 174—52)

My invention relates to a housing construction for semiconductor devices, and more specifically relates to a housing construction which affords simple manufacturing techniques while providing substantial thermal conduction to the housing portions for permitting low operating temperatures of the semiconducting device, as well as for protecting the semiconducting device from the external atmosphere.

It is well known that devices which utilize the properties of a junction in a semiconductor material such as a junction in a silicon device or germanium device for use as a rectifier, must be protected from the external atmosphere and must be maintained at a reasonably low temperature for effective operation of the device.

In addition to this, it is extremely desirable that the manufacturing techniques required for manufacturing the device be as simple as possible, particularly in the case of very small components which are to be mass produced, and are to be sold at low prices.

The principle of the present invention is to form the leads of the semiconductor device in such a manner as to serve inherently as a seat for a wafer of semiconductor material, and to cause the ends of these leads to seat the wafer in such a manner as to permit it to inherently be assembled and properly positioned within a cylindrical housing. Furthermore, at least one of the leads is caused to contact the housing in heat conducting relation, while the remaining lead extends through an enlarged cavity which later receives a potting compound which holds the opposite lead of the device mechanically spaced from the conductive housing and retains the device within the housing. Finally, the external surface of the housing may be threaded so that the device can be used as a coaxial lead device which is threaded into a chassis opening, or can be threaded into a heat sink or cooling fin.

Accordingly, a primary object of this invention is to provide a novel construction for semiconductor-type devices.

Another object of this invention is to provide a novel construction for semiconductor devices that lends itself to simplified manufacturing techniques.

A still further object of this invention is to provide a novel semiconductor device construction wherein a potting compound insulates a portion of the semiconductor assembly from a housing and retains the semiconductor assembly within the housing.

A further object of this invention is to provide a novel semiconductor assembly manufacture wherein the leads of the device serve as the mounting means for a wafer of semiconductor material.

A further object of this invention is to provide a novel housing for semiconductor devices which provide substantial thermal conduction from a semiconductor wafer and the leads attached thereto to a metallic housing.

A further object of this invention is to provide a novel housing for semiconductor devices wherein the semiconductor device is protected from the external atmosphere by a potting medium which retains the semiconductor device within a housing.

These and other objects of my invention will become apparent from the following description when taken in connection with the drawings, in which.

Figure 1:
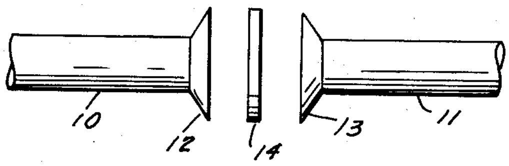
FIGURE 1 shows an exploded view of a pair of leads which are to receive a wafer of semiconductor material in accordance with the present invention.

Referring now to FIGURE 1, I show a novel construction of lead wires and a semiconductor wafer which is interposed between the leads. More specifically, a first and second lead wire 10 and 11 respectively are caused to have their opposing ends 12 and 13 respectively flared outwardly, as shown, so that the outer diameters of the flares 12 and 13 are approximately equal to the diameter of a thin wafer 14 of semiconductor material.

The wafer of semiconductor material 14 can, for example, be a wafer of silicon or germanium material which has a junction therein defining the boundary between a P-type conductivity area and an N-type conductivity area, the device acting as a rectifier. In a preferred embodiment of the invention, the wafer 14 can have a diameter of .072 inch, and a thickness of .008 inch. Conductors 10 and 11 can have a diameter of .040 inch which flares out to .072 inch at their opposing ends. The rating of such a rectifier element can, for example, be 600 reverse volts and 1 amp. forward current.

Figure 2:
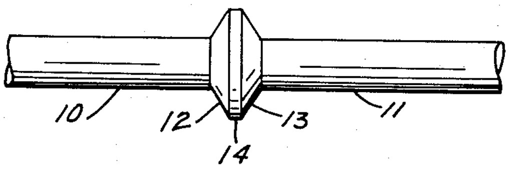
FIGURE 2 shows the leads and wafer of FIGURE 1 in their assembled condition.

The device is assembled, as shown in FIGURE 2, by appropriately soldering the left-hand surface of wafer 14 to the end of flared surface 12, and the right-hand surface of wafer 14 to the flared surface 13 of lead 11.

The soldering operation can, for example, use a soldering material of lead which is applied to the opposing surfaces of wafer 14 and held there by pressure applied to leads 10 and 11. The assembly is then brought to 600 degrees C. for approximately ½ minute to complete the soldering operation.

Figure 3:
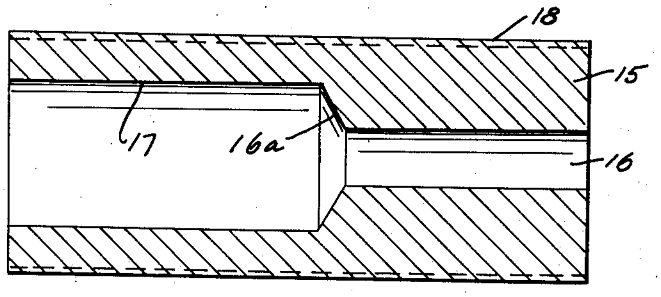
FIGURE 3 is a side cross-sectional view of a metallic housing formed in accordance with the present invention for receiving the semiconductor device assembly of FIGURE 2.
Figure 4:
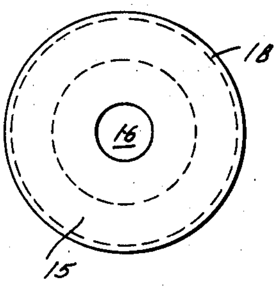
FIGURE 4 is a side view of the housing of FIGURE 3.

In order to cause the rectifier device of FIGURE 2 to operate at relatively low temperatures, and in order to protect the device from the external atmosphere, it is necessary to provide a housing for the device. In FIGURE 3 I show a housing formed in accordance with the preferred embodiment of the invention which comprises a body 15 of a conductive material such as aluminum or copper which has two concentric bores 16 and 17 therein, which are connected by tapered annular surface **16*a*. Bore 16 can have a diameter of .045 inch, while bore 17** can have a diameter of .104 inch, while the length of the housing can be ⅜ inch.

The external portions of the housing may be threaded as illustrated by thread 18 so as to increase the external surface area of the housing as well as to provide a securing means for securing the resulting device to a mounting structure.

Figure 5:
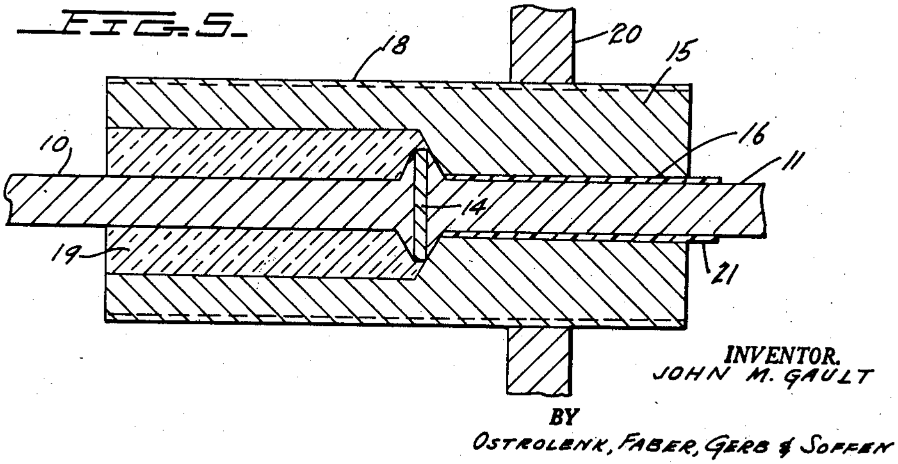
FIGURE 5 is a side cross-sectional view of the housing and semiconductor device assembly when potted into position and threaded into a chassis wall.

The device is then assembled by inserting lead 11 through opening 16, as shown in FIGURE 5, where the clearance between lead 11 and bore 16 is small enough to permit substantial heat transfer from lead 11 to the housing 16. The tapered surface 13 of lead 11 bears directly against surface **16*a* which connects bores 16 and 17 as shown in the figures. That is to say, the surfaces 13 and 16*a* form the same angle with respect to the axis of housing 15**, so that there will be a surface contact between them.

The housing 15 is, therefore, brought to the potential of lead 13, so that it is necessary that lead 10 be electrically insulated from housing 15. It is further necessary that the semiconductor device including leads 10, 11 and wafer 14 be retained within housing 15. Both of these functions are served by pouring a potting material 19 into the annular shaped opening defined between the outer diameter of lead 10 and the inner diameter of bore portion 17. This potting compound can, for example, be epoxy material which is poured into this annular chamber and cured at a temperature of 125° for 60 minutes.

The novel device of FIGURE 5 is seen to satisfy all three of the essential requirements of the device. First, the housing 15 serves as a highly efficient heat sink for the semiconductor device, since lead 11 is in close heat exchange relationship with the body 15.

Secondly, the device is protected from the external atmosphere by the potting medium 19 which further serves the novel function of retaining the semiconductor device within the housing.

Finally, the device is capable of exceedingly simple manufacturing techniques which would require a minimum of steps in the manufacturing process.

The resulting device, when having threads 18 formed in the outer housing 15, may then be threaded, for example, into a threaded opening in a chassis fragmentarily shown as chassis portion 20 where the semiconductor device is utilized as a coaxial lead device. Moreover, chassis 20 serves as an additional heat sink for the semiconductor device. If desired, the chassis 20 could be considered as a cooling fin where one or more cooling fins could be threaded onto the thread 18 of the device for improved heat dissipation, where heat dissipation requirements permit, the small additional thermal barrier, a thin electrical insulating film 21 of FIGURE 5, can be inserted between the housing 15 and the elongated lead 11 extending through the smaller diameter opening 16 thus achieving an insulated housing.

Although I have described preferred embodiments of my novel invention, many variations and modifications will now be obvious to those skilled in the art, and I prefer therefore to be limited not by the specific disclosure herein but only by the appended claims.

I claim:

1. In combination, a housing and a semiconductor device; said housing comprising a unitary cylindrical body of conductive material having an opening therethrough; said opening having a first diameter from one end of said body to a first predetermined axial position and a second diameter larger than said first diameter from the opposite end of said body to a second predetermined axial position; said semiconductor device being comprised of a body of semiconductor material having a first and second lead extending therefrom; said first and second leads being indentical to one another; said body of semiconductor material being positioned adjacent the end of said first diameter portion of said opening; said first lead extending through said first diameter portion; said second lead extending through said second diameter portion; the annular volume between said second lead and said second diameter portion being filled with a sealing medium.

2. In combination, a housing and a semiconductor device; said housing comprising a unitary cylindrical body of conductive material having an opening therethrough; said opening having a first diameter from one end of said body to a first predetermined axial position and a second diameter larger than said first diameter from the opposite end of said body to a second predetermined axial position; said semiconductor device being comprised of a body of semiconductor material having a first and second lead extending therefrom; said first and second leads being identical to one another; said body of semiconductor material being positioned adjacent the end of said first diameter portion of said opening; said first lead extending through said first diameter portion; said second lead extending through said second diameter portion; the annular volume between said second lead and said second diameter portion being filled with a sealing medium; said first lead having an insulating film thereon for insulating at least portions of said first lead from said first diameter portion.

References Cited by the Examiner

UNITED STATES PATENTS

| | | | |
|---|---|---|---|
| 2,468,845 | 5/49 | Thompson | 317—234 |
| 2,516,344 | 7/50 | Ross et al. | 317—234 X |
| 2,752,553 | 6/56 | Dunlap | 317—234 |
| 2,780,758 | 2/57 | Zetow | 317—234 |
| 2,822,512 | 2/58 | French | 317—234 |
| 2,862,158 | 11/58 | Stelmak | 317—234 |

LARAMIE E. ASKIN, *Primary Examiner.*

SAMUEL BERNSTEIN, DAVID J. GALVIN, E. JAMES SAX, *Examiners.*